United States Patent
Watanabe et al.

(10) Patent No.: US 9,397,185 B2
(45) Date of Patent: Jul. 19, 2016

(54) SEMICONDUCTOR DEVICE

(71) Applicant: ROHM CO., LTD., Kyoto-shi, Kyoto (JP)

(72) Inventors: Heiji Watanabe, Suita (JP); Takuji Hosoi, Suita (JP); Takayoshi Shimura, Suita (JP); Ryota Nakamura, Kyoto (JP); Yuki Nakano, Kyoto (JP); Shuhei Mitani, Kyoto (JP); Takashi Nakamura, Kyoto (JP); Hirokazu Asahara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/649,149

(22) PCT Filed: Dec. 2, 2013

(86) PCT No.: PCT/JP2013/082390
§ 371 (c)(1),
(2) Date: Jun. 2, 2015

(87) PCT Pub. No.: WO2014/087975
PCT Pub. Date: Jun. 12, 2014

(65) Prior Publication Data
US 2015/0318372 A1     Nov. 5, 2015

(30) Foreign Application Priority Data

Dec. 4, 2012 (JP) .................................. 2012-265615

(51) Int. Cl.
*H01L 29/51* (2006.01)
*H01L 29/78* (2006.01)
(Continued)

(52) U.S. Cl.
CPC .......... *H01L 29/513* (2013.01); *H01L 29/1602* (2013.01); *H01L 29/1608* (2013.01);
(Continued)

(58) Field of Classification Search
CPC .............. H01L 29/513; H01L 29/1602; H01L 29/1608; H01L 29/2003; H01L 29/4916; H01L 29/4236; H01L 29/495; H01L 29/517; H01L 29/518; H01L 29/7802; H01L 29/7813; H01L 29/41766
See application file for complete search history.

(56) References Cited

U.S. PATENT DOCUMENTS

| | | | | |
|---|---|---|---|---|
| 6,246,076 B1* | 6/2001 | Lipkin | ................. | H01L 21/045 257/410 |
| 2005/0017319 A1* | 1/2005 | Manabe | ............ | H01L 21/28185 257/498 |

FOREIGN PATENT DOCUMENTS

| | | |
|---|---|---|
| JP | 2002-524860 | 8/2002 |
| JP | 2009-016530 | 1/2009 |

(Continued)

OTHER PUBLICATIONS

International Search Report, Mar. 4, 2014; PCT/JP2013/082390.

*Primary Examiner* — Whitney T Moore
(74) *Attorney, Agent, or Firm* — Hamre, Schumann, Mueller & Larson, P.C.

(57) ABSTRACT

A semiconductor device according to the present invention has a MIS structure that includes a semiconductor layer, a gate insulating film in contact with the semiconductor layer, and a gate electrode formed on the gate insulating film, and the gate insulating film includes an AlON layer with a nitrogen composition of 5% to 40%. A semiconductor device is thereby provided with which electron trapping in the gate insulating film can be reduced and shifting of a threshold voltage $V_{th}$ can be suppressed.

12 Claims, 9 Drawing Sheets

(51) Int. Cl.
  *H01L 29/49*   (2006.01)
  *H01L 29/423*  (2006.01)
  *H01L 29/16*   (2006.01)
  *H01L 29/20*   (2006.01)
  *H01L 29/417*  (2006.01)

(52) U.S. Cl.
  CPC ........ *H01L29/2003* (2013.01); *H01L 29/4236* (2013.01); *H01L 29/495* (2013.01); *H01L 29/4916* (2013.01); *H01L 29/517* (2013.01); *H01L 29/518* (2013.01); *H01L 29/7802* (2013.01); *H01L 29/7813* (2013.01); *H01L 29/41766* (2013.01)

(56) References Cited

FOREIGN PATENT DOCUMENTS

| | | |
|---|---|---|
| WO | 00/13236 | 3/2000 |
| WO | 03/026019 | 3/2003 |

\* cited by examiner

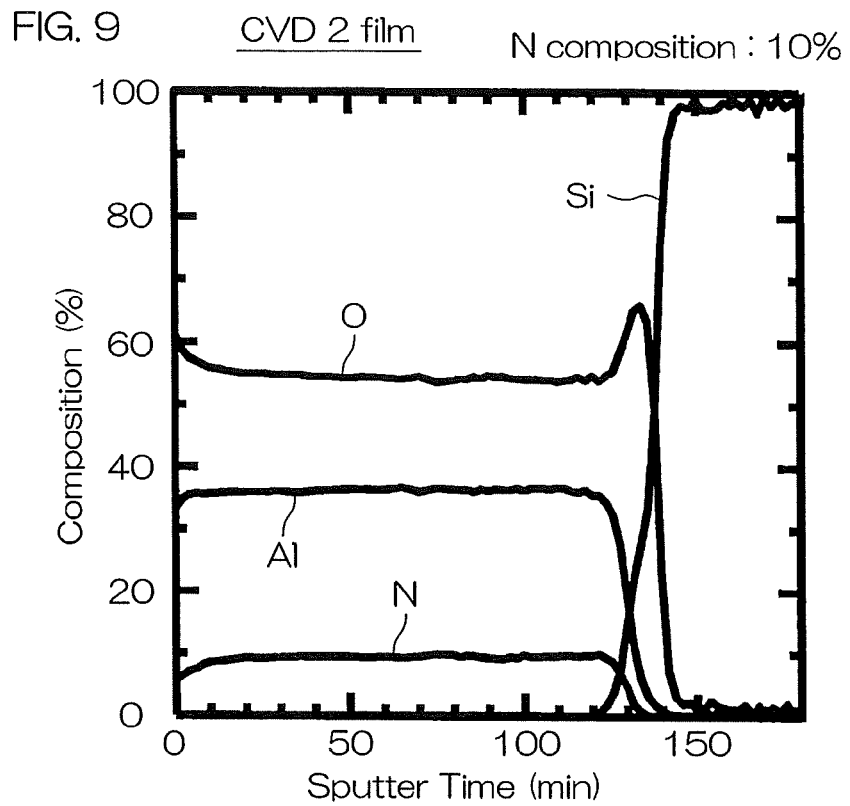
FIG. 9 CVD 2 film   N composition: 10%
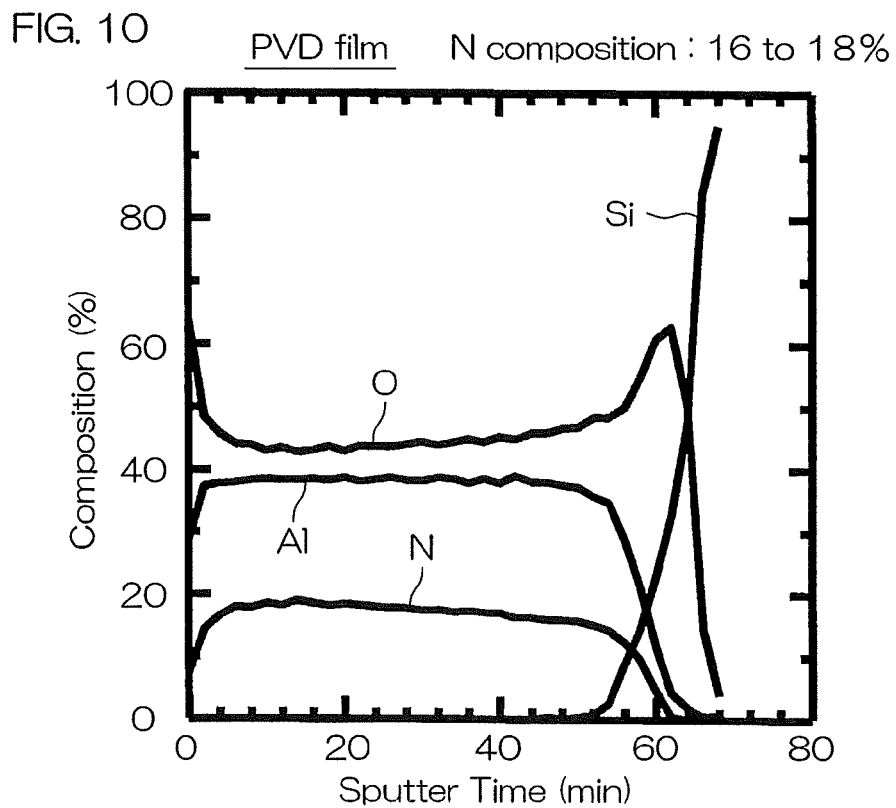
FIG. 10 PVD film   N composition: 16 to 18%

SEMICONDUCTOR DEVICE

FIELD OF THE ART

The present invention relates to a semiconductor device having a MIS structure.

BACKGROUND ART

SiC (silicon carbide) excels over Si (silicon) in dielectric breakdown resistance, heat conductivity, etc. SiC is thus noted as a semiconductor favorable for application, for example, in inverters of hybrid vehicles, etc. A MISFET (metal insulator semiconductor field effect transistor) that uses SiC is anticipated for use as a high-voltage device favorable for inverters of hybrid vehicles, etc.

As an example of a MISFET that uses SiC, Patent Document 1 discloses an SiC semiconductor device that includes an n type SiC substrate, an n type drift layer formed on the SiC substrate, a p type well region formed in the drift layer, an n type source region formed in the p type well region, a gate insulating film formed on a front surface of the drift layer, and a gate electrode formed on the gate insulating film.

PRIOR ART DOCUMENTS

Patent Documents

Patent Document 1: Japanese Patent Application Publication No. 2009-16530
Patent Document 2: Japanese Translation of International Application (Kohyo) No. 2002-524860

SUMMARY OF THE INVENTION

Problems to be Solved by the Invention

One of the issues of an SiC-MISFET, such as that of Patent Document 1, is low channel mobility. Low channel mobility is caused by defects being present at high density (by the number of interface traps being large) at a MIS interface of SiC. That is, the defects make the forming of a channel at the MIS interface difficult by capturing (trapping) positive holes or electrons.

Conventionally, a comparatively thin $SiO_2$ film is used as a gate insulating film and a gate is driven at an electric field that is higher in comparison to that used in an Si-MISFET to make the captured positive holes and electrons be released from defects easily. However, with this method, degradation of the gate insulating film is accelerated and may cause lowering of device reliability.

On the other hand, if a high dielectric constant film (high-k film), such as a film of $Al_2O_3$ or $HfO_2$, etc., is used as the gate insulating film, it may be possible to increase the film thickness in comparison to the $SiO_2$ film while maintaining the same gate capacitance. However, in this case, electrons are captured in the gate insulating film, causing the problem of shifting of a flatband voltage $V_{FB}$ and shifting of a threshold voltage $V_{th}$.

An object of the present invention is thus to provide a semiconductor device, with which electron trapping in a gate insulating film is reduced and shifting of a threshold voltage $V_{th}$ can be suppressed.

Means for Solving the Problem

The present invention has a MIS structure that includes a semiconductor layer, a gate insulating film in contact with the semiconductor layer, and a gate electrode formed on the gate insulating film, and the gate insulating film includes an AlON layer with a nitrogen composition of 5% to 40%.

With this arrangement, electron trapping in the gate insulating film can be reduced because the gate insulating film includes the AlON layer with a nitrogen composition of 5% to 40%. Shifting of a flatbandvoltage $V_{FB}$ can thereby be suppressed and shifting of a threshold voltage $V_{th}$ can thus be suppressed. Reduction of gate leakage current can also be achieved. Also in comparison to using a single layer film of $SiO_2$, thickening can be achieved while maintaining the same gate capacitance, thereby enabling suppression of degradation of the gate insulating film even when a gate is driven at a high voltage. Consequently, lowering of device reliability can be suppressed.

Also preferably, the AlON layer has a thickness of not less than 50 nm.

Preferably, the AlON layer is amorphous or microcrystalline. With this arrangement, crystal grain boundaries within the gate insulating film can be decreased to reduce the gate leakage current.

Preferably, the gate insulating film has a laminated structure that includes a base $SiO_2$ layer in contact with the semiconductor layer and the AlON layer laminated on the base $SiO_2$ layer. If the portion of the gate insulating film in contact with the semiconductor layer is $SiO_2$, the shift amount of the flatband voltage $V_{FB}$ can be reduced. Also, transistor characteristics of the MIS structure can be controlled in the same manner as is performed conventionally, thus enabling simplification of design of the transistor characteristics. The base $SiO_2$ layer is preferably a thermal oxide film.

Preferably, the base $SiO_2$ layer has a thickness of not less than 5 nm. With this arrangement, the gate leakage current can be made high in rising electric field, thereby enabling the occurrence of leakage current during ordinary driving of the gate to be suppressed.

Preferably, the laminated structure further includes an upper $SiO_2$ layer laminated on the AlON layer. With this arrangement, the AlON layer is covered at the upper side and therefore the AlON layer can be protected, for example, from a chemical agent used in etching or cleaning during gate electrode formation. Damaging of the AlON layer can consequently be suppressed.

Also preferably, the upper $SiO_2$ layer contains Al and/or N at an interface with the AlON layer. With this arrangement, electron implantation into the gate insulating film can be suppressed.

The semiconductor layer may be constituted of SiC, GaN, or diamond. Also preferably, the gate electrode is constituted of polysilicon or a metal including at least one type of metal selected from the group consisting of Mo, W, Cu, Ni, Al, Ti, Ag, Au, and Pt. A metal electrode (metal gate) can be formed as a film at a lower temperature compared, for example, to a polysilicon electrode (polysilicon gate) and thus enables the temperature environment during the film formation to be kept relatively low. The AlON layer is thereby made less likely to reach a crystallization temperature and crystallization of the AlON layer can thus be suppressed. Consequently, increase of the gate leakage current due to increase of crystal grain boundaries can be suppressed. Gate resistance can also be reduced in comparison to a polysilicon gate, enabling realization of switching operation of higher speed and reduction of switching loss.

Also, the MIS structure may include a trench gate type structure or may include a planar gate structure.

BRIEF DESCRIPTION OF THE DRAWINGS

FIG. 9 is a graph of composition in the depth direction of an AlON film (CVD 2 film) prepared by a CVD 2 method.

FIG. 10 is a graph of composition in the depth direction of an AlON film (PVD film) prepared by a PVD method.

MODES FOR CARRYING OUT THE INVENTION

Preferred embodiments of the present invention shall now be described in detail with reference to the attached drawings.

Figure 1:
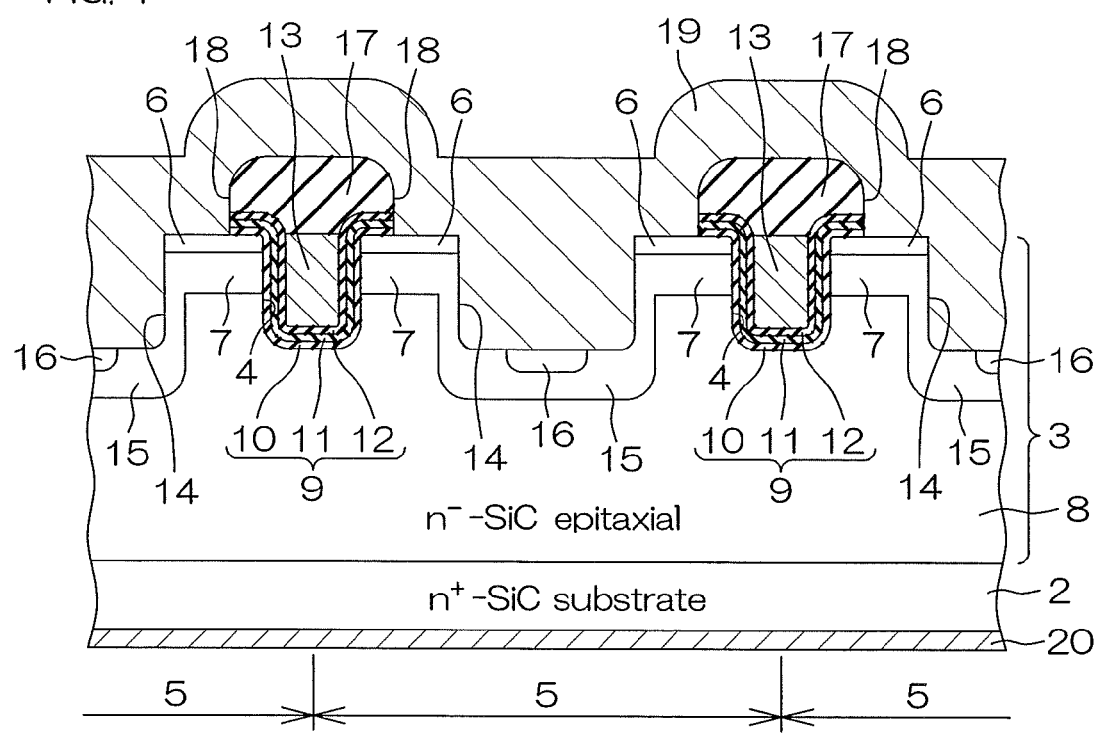
FIG. 1 is a sectional view of a semiconductor device according to a first preferred embodiment of the present invention.

FIG. 1 is a sectional view of a semiconductor device according to a first preferred embodiment of the present invention.

The semiconductor device 1 includes a SiC substrate 2 of an $n^+$ type (for example, with a concentration of $1 \times 10^{19}$ to $5 \times 10^{19}$ $cm^{-3}$) and a SiC epitaxial layer 3 of an $n^-$ type (for example, with a concentration of $1 \times 10^{15}$ to $1 \times 10^{16}$ $cm^{-3}$) that is formed on the SiC substrate 2. The SiC substrate 2 and the SiC epitaxial layer 3 constitute an example of a "semiconductor layer" of the present invention. The SiC substrate 2 and the SiC epitaxial layer 3 function as a drain of the semiconductor device 1. As the n type impurity, phosphorus (P) or arsenic (As), etc., is contained. The same n type impurity is contained in n type SiC's mentioned below.

Gate trenches 4 are formed in the SiC epitaxial layer 3 by digging in from a front surface thereof toward the SiC substrate 2. The gate trenches 4 are formed, for example, in lattice form or stripe form. A plurality of unit cells 5, partitioned by the gate trenches 4, are thereby formed in the SiC epitaxial layer 3.

At peripheries of the gate trenches 4 in the SiC epitaxial layer 3, source regions 6 of the $n^+$ type and body regions 7 of a p type (for example, with a concentration of $1 \times 10^{17}$ to $5 \times 10^{17}$ $cm^{-3}$) are formed in that order from the side closer to the front surface of the SiC epitaxial layer 3. As the p type impurity, for example, boron (B) or aluminum (Al), etc., is contained in the body regions 7. The same p type impurity is contained in p type SiC's mentioned below.

The source region 6 is formed on a front surface portion of each unit cell 5 so as to be exposed on the front surface of the SiC epitaxial layer 3 and so as to define an upper portion (a portion) of a side surface of each gate trench 4. On the other hand, the body region 7 is formed so as to contact the source region 6 at the SiC substrate 2 side (rear surface side of the SiC epitaxial layer 3) with respect to the source region 6 and so as to define a lower portion (a portion) of the side surface of each gate trench 4.

A region of the SiC epitaxial layer 3 at the SiC substrate 2 side with respect to the body region 7 is an $n^-$ type drain region 8 that is maintained as it is in a state after epitaxial growth. The drain region 8 contacts the body region 7 at the SiC substrate 2 side with respect to the body region 7 and defines a bottom surface of the gate trench 4.

On an inner surface of each gate trench 4, a gate insulating film 9 is formed so as to cover the entire inner surface. The gate insulating film 9 includes a base $SiO_2$ film 10, an AlON film 11, and an upper $SiO_2$ film 12 that are successively laminated from the inner surface side of the gate trench 4. In the present preferred embodiment, the base $SiO_2$ film 10 is formed so as to contact the entire inner surface of the gate trench 4 and thereabove, each of the AlON film 11 and the upper $SiO_2$ film 12, having the same shape as the base $SiO_2$ film 10, is laminated successively so as to cover the entirety of the film directly below. The three-layer structure of these films may be formed across the entire inner surface of the gate trench 4 as in the present preferred embodiment or may be formed selectively at channel portions of the inner surface of the gate trench 4 (the portions of the side surface of the gate trench 4 at which the body regions 7 are exposed). In this case, other portions of the gate insulating film 9 may be arranged as a single layer film constituted of $SiO_2$. Also, the gate insulating film 9 may be a single layer film of the AlON film 11 or may be a film with a two-layer structure with which the upper $SiO_2$ film 12 is omitted (base $SiO_2$ film 10/AlON film 11). Also in the present preferred embodiment, the gate insulating film 9 may be formed to cover an opening end side edge portion of the gate trench 4. The opening end side edge portion of the gate trench 4 defines an included angle between the front surface of the SiC epitaxial layer 3 and the side surface of the gate trench 4. Portions in the respective vicinities of the front surface of the SiC epitaxial layer 3 in the source region 6 and the side surface of the gate trench 4 are thus covered by the gate insulating film 9.

The gate insulating film 9 has a thickness of, for example, 55 nm to 150 nm. The preferable ranges of thickness of the respective films are not less than 5 nm (more preferably, 5 nm to 20 nm) for the base $SiO_2$ film 10, not less than 50 nm (more preferably, 50 nm to 100 nm) for the AlON film 11, and not less than 0 nm (more preferably, 0 nm to 30 nm) for the upper $SiO_2$ film 12.

In the present preferred embodiment, the base $SiO_2$ film 10 is formed, for example, by thermal oxidation of the SiC epitaxial layer 3. By arranging the film in contact with the SiC epitaxial layer 3 (especially, the channel portion) as a thermal oxide film, transistor characteristics that are excellent in comparison to a deposited film, such as a CVD film, etc., can be expressed.

The AlON film 11 is a film with which nitrogen (N) atoms are dispersed inside the film and is, for example, a film with a nitrogen composition of 5% to 40% (preferably 15% to 35%). The nitrogen composition falls within the above range at any position in the depth direction of the AlON film 11. That is, the nitrogen composition of the AlON film 11 is substantially fixed in the depth direction and preferably falls within ±5% to ±20% with respect to an average value in the depth direction. It is also preferable for the respective compositions of the other atoms (Al and O) of the AlON film 11 to be substantially fixed in the depth direction. If the nitrogen composition is within the above range, a flatband voltage $V_{FB}$ of the semiconductor device 1 can be suppressed more satisfactorily and reduction of gate leakage current can be achieved. Also, the AlON film 11 is preferably amorphous or microcrystalline. If the AlON film 11 has such a structure, crystal grain boundaries in the gate insulating film 9 can be decreased and the gate leakage current can thus be reduced.

Although the upper SiO film 12 is mainly constituted of silicon oxide, it may also contain Al and/or N at an interface (vicinity of the interface) with the AlON film 11. With this arrangement, electron implantation into the gate insulating film 9 can be suppressed.

Such a gate insulating film 9 can be formed, for example, by successively laminating the base $SiO_2$ film 10, the AlON film 11, and the upper $SiO_2$ film 12 after forming the gate trench 4 in the SiC epitaxial layer 3. The base $SiO_2$ film 10 can be formed, for example, by a thermal oxidation method (for example, at 1100° C. to 1300° C.). Also, the AlON film 11 can be formed by depositing the respective atoms, for example, by an ALD (atomic layer deposition) method, a CVD method, or a PVD (physical vapor deposition) method, etc. Also, the upper $SiO_2$ film 12 can be formed, for example, by the CVD method.

PDA (post deposition annealing) at, for example, 700° C. to 1000° C. may be performed after forming the AlON film 11. Shifting of the flatband voltage $V_{FB}$ can thereby be suppressed more satisfactorily.

In each gate trench 4, a gate electrode 13 is embedded at the inner side of the gate insulating film 9. A trench gate type MIS structure is thereby arranged in which the source region 6, the body region 7, and the drain region 8 that define the inner surface of the gate trench 4 face the gate electrode 13 across the gate insulating film 9.

Although the gate electrode 13 is preferably constituted of a metal including at least one type of metal selected from the group consisting of Mo, W, Cu, Ni, Al, Ti, Ag, Au, and Pt, it may also be constituted of polysilicon (for example, polysilicon doped with an impurity).

At a central portion of each unit cell 5, a source trench 14 is formed by digging in from the front surface of the SiC epitaxial layer 3 toward the SiC substrate 2. The source trench 14 penetrates through the source region 6 and the body region 7 from the front surface of the SiC epitaxial layer 3 and reaches the drain region 8. In the present preferred embodiment, the source trench 14 is formed to the same depth as the gate trench 4.

In the SiC epitaxial layer 3, a p type region 15 is formed at a periphery of the source trench 14. In a lower region of the body region 7, the p type region 15 is exposed at an inner surface of the source trench 14 so as to be continuous (so as to be connected) to the body region 7. That is, at the lower region, the p type region 15 is interposed between the drain region 8 and the inner surface of the source trench 14. The p type region 15 is thereby exposed at a bottom surface and a bottom side edge portion of the source trench 14.

Also, in the p type region 15, a p+ type body contact region 16 is formed at the bottom surface of the source trench 14. In the present preferred embodiment, the body contact region 16 is disposed at a central portion separated to the inner side by an interval from the side surface of the source trench 14.

An interlayer insulating film 17 is formed on the SiC epitaxial layer 3 so as to cover the gate electrodes 13. A contact hole 18 of a larger diameter than the source trench 14 is formed in the interlayer insulating film 17. The entirety of the source trench 14 (that is, the entire inner surface of the source trench 14) and a portion of the source region 6 of each unit cell 5 are thus exposed inside the contact hole 18.

A source electrode 19 is formed on the interlayer insulating film 17. The source electrode 19 enters via the respective contact holes 18 into the source trenches 14 of all unit cells 5 collectively. The source electrode 19 contacts the body contact region 16, the p type region 15, the body region 7, and the source region 6 successively from the bottom side of the source trench 14. That is, the source electrode 19 is a wiring in common to all unit cells 5. In the present preferred embodiment, the source electrode 19 has a structure in which a Ti/TiN layer and an Al layer are laminated successively from the side in contact with the SiC epitaxial layer 3.

A drain electrode 20 is formed on the rear surface of the SiC substrate 2 so as to cover the entire rear surface. The drain electrode 20 is an electrode in common to all unit cells 5. As the drain electrode 20, for example, a laminated structure (Ti/Ni/Au/Ag) may be employed in which Ti, Ni, Au, and Ag are laminated successively from the SiC substrate 2 side.

With the semiconductor device 1, electron trapping in the gate insulating film 9 can be reduced because the gate insulating film 9 includes the AlON film 11 with a nitrogen composition of 5% to 40%. Shifting of the flatband voltage $V_{FB}$ can thereby be prevented and shifting of the threshold voltage $V_{th}$ can thus be suppressed.

Also, in comparison to using a single layer film of $SiO_2$, the gate insulating film 9 can be thickened as a whole while maintaining the same gate capacitance by making the AlON film 11 appropriately thick. Degradation of the gate insulating film 9 can thus be suppressed even when the gate is driven at a high voltage. Consequently, lowering of device reliability can be suppressed.

Also, by interposing the base $SiO_2$ film 10 below the AlON film 11 and further making the film thickness thereof not less than 5 nm, the gate leakage current can be made high in rising electric field. The occurrence of leakage current during ordinary driving of the gate can consequently be suppressed.

Further, by laminating the upper $SiO_2$ film 12 on the AlON film 11 to cover the AlON film 11 at the upper side, the AlON film 11 can be protected, for example, from a chemical agent used in etching or cleaning during formation of the gate electrode 13. Damaging of the AlON film 11 can consequently be suppressed.

Also, if the gate electrode 13 is a metal gate, it can be formed as a film at a lower temperature compared to a polysilicon gate. The temperature environment during the film formation can thus be kept relatively low. For example, whereas film formation of a metal is performed at approximately 200° C., the temperature environment reaches 1000° C. in polysilicon film formation. The AlON film 11 that is formed in advance is thereby made less likely to reach a crystallization temperature and crystallization of the AlON film 11 can thus be suppressed. Consequently, increase of the gate leakage current due to increase of crystal grain boundaries can be suppressed. Gate resistance can also be reduced in comparison to a polysilicon gate, enabling realization of switching operation of higher speed and reduction of switching loss.

Figure 2:
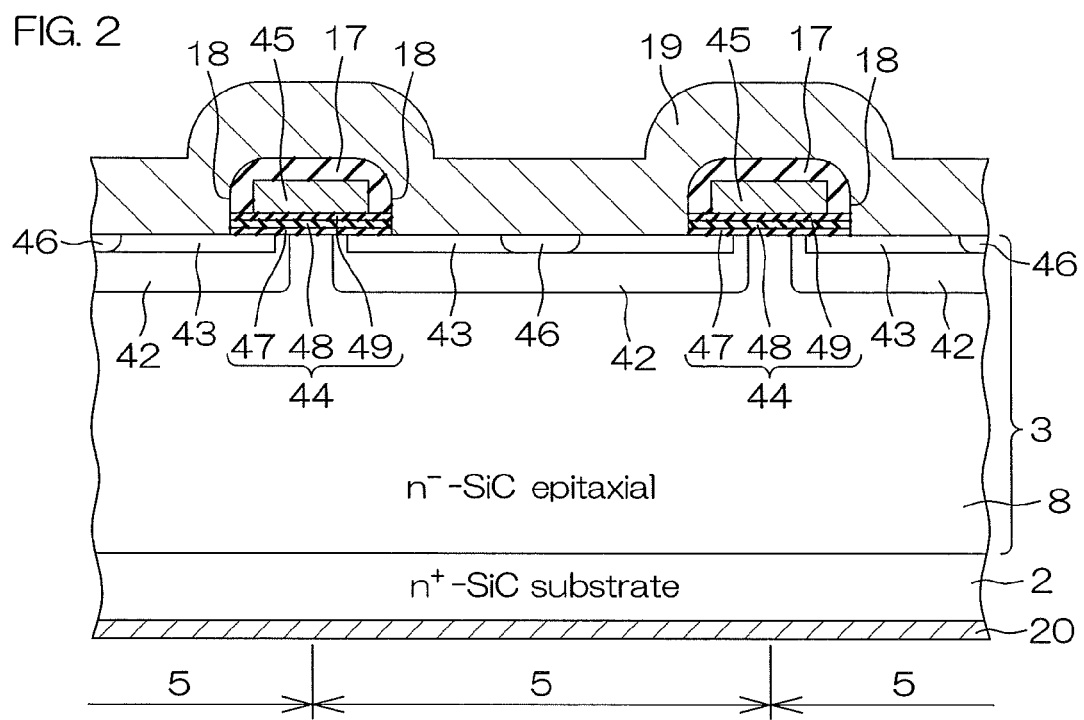
FIG. 2 is a sectional view of a semiconductor device according to a second preferred embodiment of the present invention.

FIG. 2 is a sectional view of a semiconductor device according to a second preferred embodiment of the present invention. In FIG. 2, portions corresponding to respective portions shown in FIG. 1 in the description above are provided with the same reference symbols.

With the first preferred embodiment described above, the MIS structure is arranged as a trench gate type with the gate electrode 13 facing the source region 6, the body region 7, and the drain region 8, which define the inner surface of the gate trench 4, across the gate insulating film 9.

On the other hand, the MIS structure of the semiconductor device 41 according to the second preferred embodiment is arranged as a planar gate type.

The planar gate type MIS structure includes a p type body region 42 formed selectively in a front surface portion of the SiC epitaxial layer 3, an $n^+$ type source region 43 formed selectively in the body region 42, a gate insulating film 44 formed on the front surface of the SiC epitaxial layer 3, a gate electrode 45 facing the body region 42, exposed at the front surface of the SiC epitaxial layer 3, across the gate insulating film 44, and a $p^+$ type body contact region 46 penetrating through the source region 43 from the front surface of the SiC epitaxial layer 3 and having a deepest portion that reaches the body region 42.

As with the gate insulating film 9 of the first preferred embodiment, the gate insulating film 44 of the semiconductor device 41 also includes a base $SiO_2$ film 47, an AlON film 48, and an upper $SiO_2$ film 49 that are successively laminated from the front surface side of the SiC epitaxial layer 3 so that the same actions and effects as the semiconductor device 1 of the first preferred embodiment can be expressed.

Although preferred embodiments of the present invention have been described above, the present invention may be implemented in yet other modes.

For example, although in each of the semiconductor devices 1 and 41, an arrangement with which the conductivity types of the respective semiconductor portions are inverted may be adopted. For example, in the semiconductor device 1, a p type portion may be of an n type and an n type portion may be of a p type.

Also, although with the preferred embodiment described above, the semiconductor device 1 having the SiC layer was taken up as an example of a semiconductor device according to the present invention, the structure described above with the preferred embodiment may also be applied to a semiconductor device having a layer constituted of GaN or diamond.

Also, although with each of the preferred embodiments, a MISFET of the trench gate type or the planar gate type was taken up as an example of the present invention, the present invention may also be applied to a MIS transistor structure, such as a CMOSFET (complementary metal oxide semiconductor field effect transistor), etc.

Besides the above, various design modifications may be made within the scope of the matters described in the claims.

<Verification Examples>

The following verification examples were carried out to confirm the effects (1) to (6).

(1) Dependence of gate leakage current on base $SiO_2$ film thickness (simulation)

First, how the gate leakage current changes with change of thickness of the base $SiO_2$ film 10 in the preferred embodiment described above was verified using a simulation device. As simulation conditions, the thickness of the base $SiO_2$ film 10 was set to 1 nm, 2 nm, 3 nm, 4 nm, 5 nm, and 6 nm. The results are shown in FIG. 3.

Figure 3:
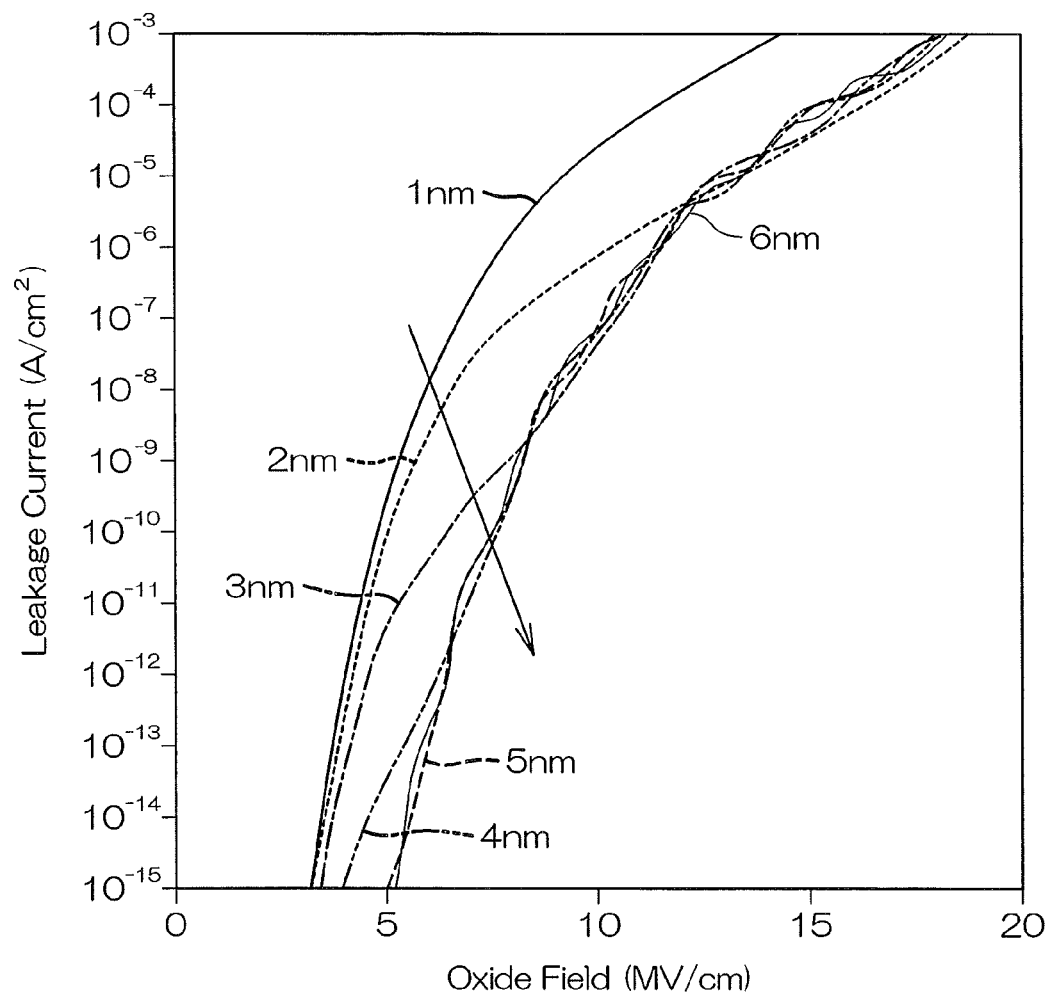
FIG. 3 shows simulation data for demonstrating the dependence of gate leakage current on base $SiO_2$ film thickness.

As shown in FIG. 3, it was found that the thicker the base $SiO_2$ film 10, the more the gate leakage current can be reduced. In particular, it can be understood that the gate leakage current can be reduced effectively if the thickness of the base $SiO_2$ film 10 is not less than 5 nm.

(2) Dependence of gate leakage current on base $SiO_2$ film thickness (experimental examples)

Next, a specific experiment was carried out to empirically verify the dependence of the gate leakage current on the thickness of a base $SiO_2$ film. First, a base $SiO_2$ film was formed by thermal oxidation (dry oxidation) of a (0001) surface of an n type 4H-SiC substrate. An AlON film was thereafter deposited to 90 nm by a CVD method. Thereafter, without applying heat treatment, an aluminum film was deposited by a sputtering method and the aluminum film was patterned by photolithography to form an aluminum pad. MIS structures shown in FIG. 4 were thereby prepared. As experimental conditions, the thickness of the base $SiO_2$ film was set to none (0 nm), less than 6 nm, 6 nm, and 13 nm. Also, EOT (equivalent oxide thickness) values of the respective experimental examples were 143.8 nm, 57.6 nm, 58.6 nm, and 66.9 nm, respectively, in the order of mention of the experimental conditions above.

Figure 4:
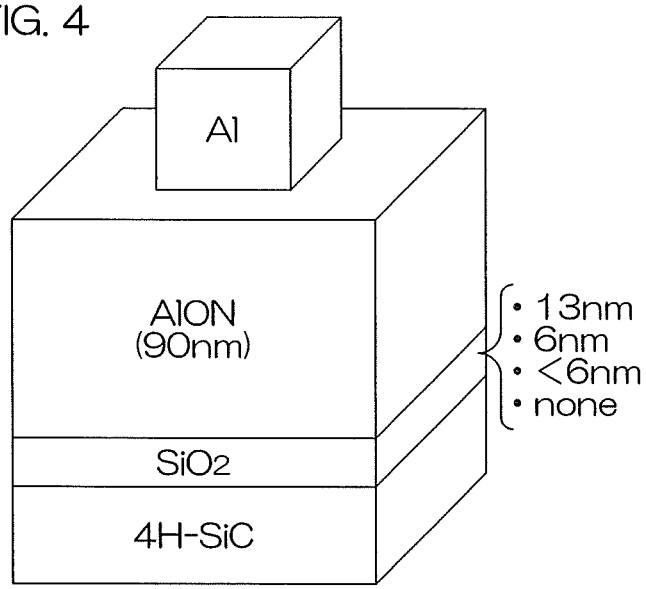
FIG. 4 is a perspective view of semiconductor devices used to demonstrate the dependence of the gate leakage current.
Figure 5:
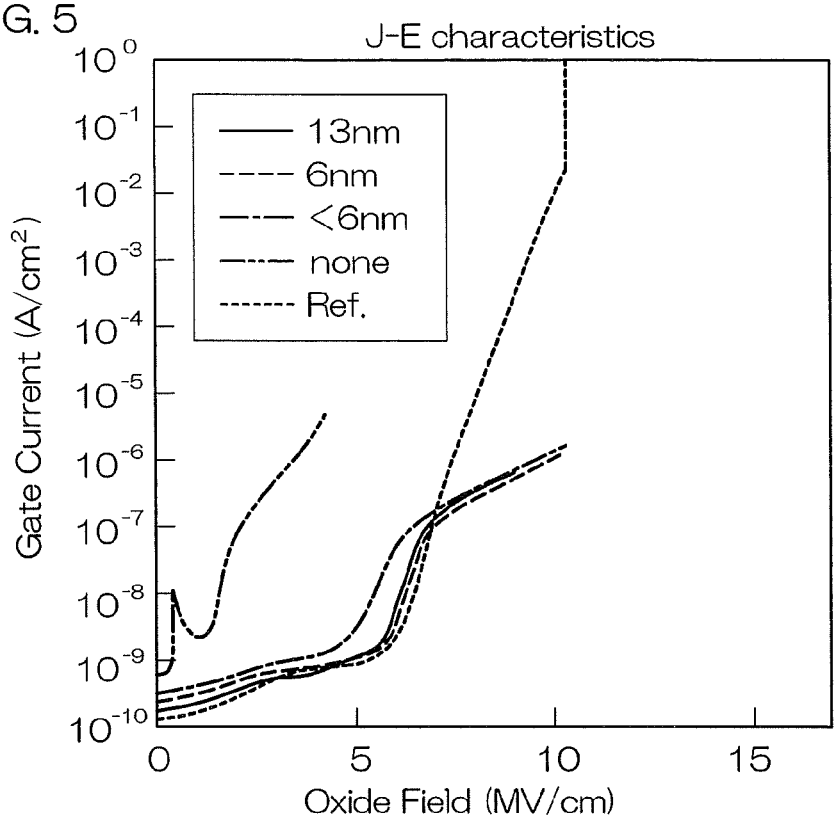
FIG. 5 shows J-E curves for demonstrating the dependence of the gate leakage current in the semiconductor devices of FIG. 4.

Next, J-E characteristics of the MIS structures of FIG. 4 were determined. The results are shown in FIG. 5. In FIG. 5, the curve indicated by "Ref." is the J-E curve of a MIS structure adopting a $NO_x$—$SiO_2$ film (48 nm) in place of the gate insulating film constituted of the base $SiO_2$ film and the AlON film.

As shown in FIG. 5, the rising electric fields of the gate leakage currents of the respective experimental examples were: "none"=approximately 2 MV/cm; "<6 nm"=approximately 4 MV/cm; "6 nm"=approximately 6 MV/cm; and "13 nm"=approximately 6 mV/cm. From these experimental results, it was found that in comparison to the case where the AlON film is formed directly on the 4H-SiC substrate ("none"), the rising electric field of the gate leakage current can be made higher by interposing the base $SiO_2$ film in between with respect to the substrate. In particular, it was found that it is preferable for the base $SiO_2$ film to be not less than 6 nm. From the experimental examples and the results of the simulation, it was found that if the thickness of the base $SiO_2$ film 10 is not less than 5 nm, the gate leakage current during ordinary driving of the gate can be reduced effectively.

(3) Dependence of shifting of flatband voltage $V_{FB}$ on base $SiO_2$ film thickness Next, C-V characteristics of the MIS structures of FIG. 4 when a starting voltage is set to 10V and sweeping is performed in the manner of +10V→−10V→+10V were determined. The results are shown in FIG. 6.

Figure 6:
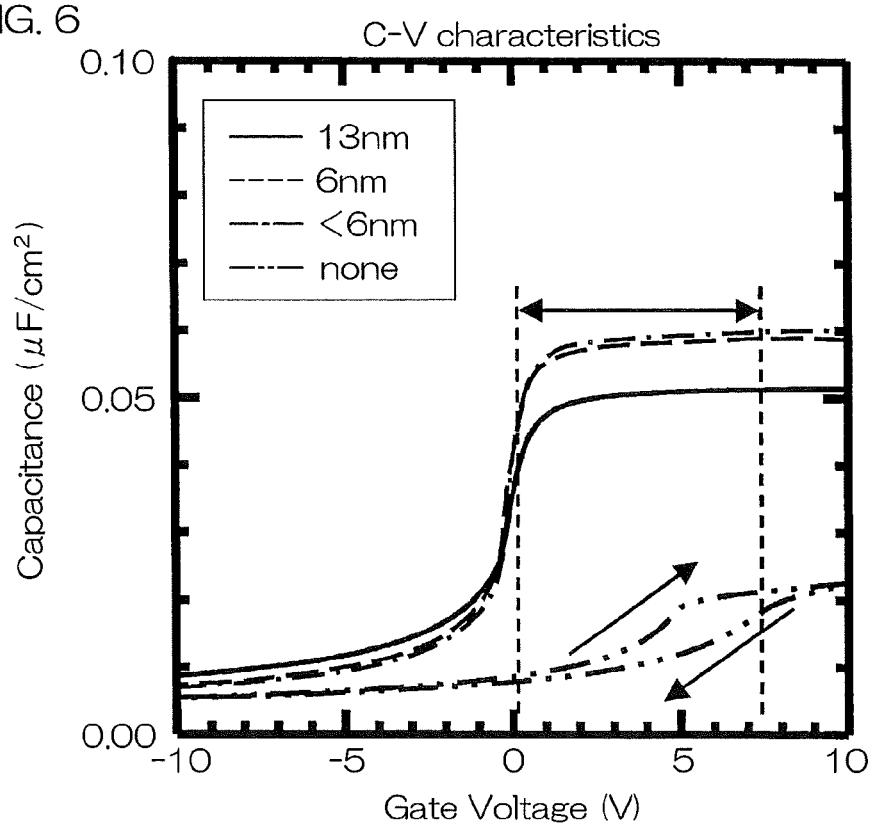
FIG. 6 shows C-V curves of the semiconductor devices of FIG. 4 for demonstrating the dependence of shifting of flatband voltage $V_{FB}$ on base $SiO_2$ film thickness.

As shown in FIG. 6, it was found that with each of the MIS structures (<6 nm, 6 nm, and 13 nm) with which the base $SiO_2$ film is interposed between the AlON film and the substrate, the shift amount of the flatband voltage $V_{FB}$ can be reduced in comparison to the case where the AlON film is formed directly on the 4H-SiC substrate ("none").

(4) Dependence of shift amount of flatband voltage $V_{FB}$ on base $SiO_2$ film thickness Next, C-V characteristics were determined in accordance with (3) above under conditions where the starting voltage was changed. As the conditions, the starting voltage was changed from +5V to +60V in increments of 5V. The relationship of accumulation voltage and flatband voltage in this case is shown in FIG. 7.

Figure 7:
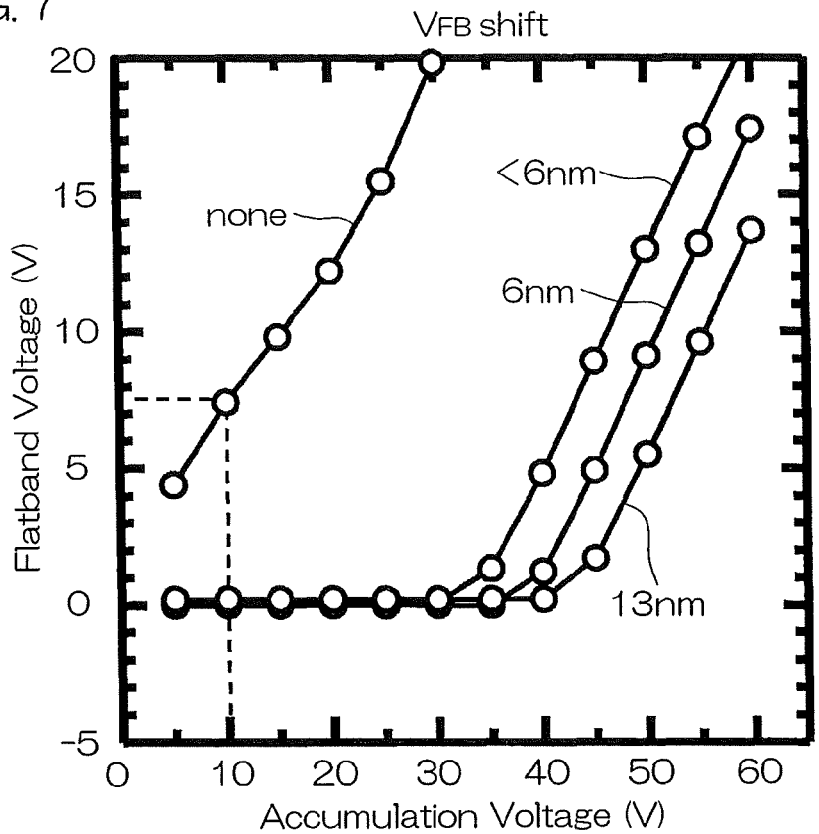
FIG. 7 is a graph for demonstrating the dependence of shift amount of flatband voltage $V_{FB}$ on base $SiO_2$ film thickness.

As shown in FIG. 7, it was found that if the accumulation voltage is the same, the thicker the base $SiO_2$ film 10, the more the flatband voltage $V_{FB}$ shift amount can be reduced. For example, it was found that in the case of an accumulation voltage of 45V, the shift amount with each MIS structure was: "<6 nm"=approximately 9V; "6 nm"=approximately 5V; and "13 nm"=approximately 1V.

(5) Dependence of shifting of flatband voltage $V_{FB}$ on N composition

Figure 8:
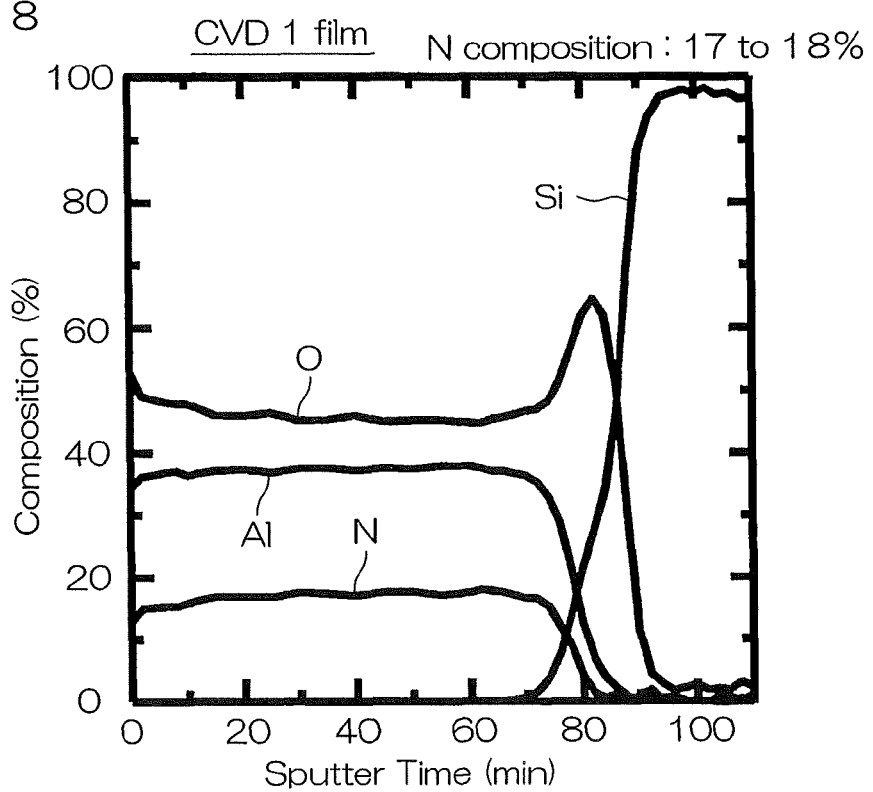
FIG. 8 is a graph of composition in a depth direction of an AlON film (CVD 1 film) prepared by a CVD 1 method.

Next, a specific experiment was carried out to empirically verify the dependence of the shifting of flatband voltage $V_{FB}$ on the N composition. As experimental samples, the MIS structures shown in FIG. 4 were prepared in accordance with the method described in (2) above. However, three patterns of experimental samples differing in film forming method of the AlON film were prepared. The three film forming methods adopted were a CVD 1 method, a CVD 2 method, and PVD method. The compositions of a CVD 1 film, a CVD 2 film, and a PVD film thus obtained are shown respectively in FIG. 8 to FIG. 10. In regard to the CVD 1 film and the CVD 2 film, samples (CVD1+PDA, CVD2+PDA) with which PDA was performed after film formation were also prepared.

Next, the C-V characteristics of the respective samples were determined in accordance with the measurement methods described in (3) and (4) above. The relationship between accumulation voltage and flatband voltage were then examined based on the C-V characteristics obtained. The results are shown in FIG. 11.

Figure 11:
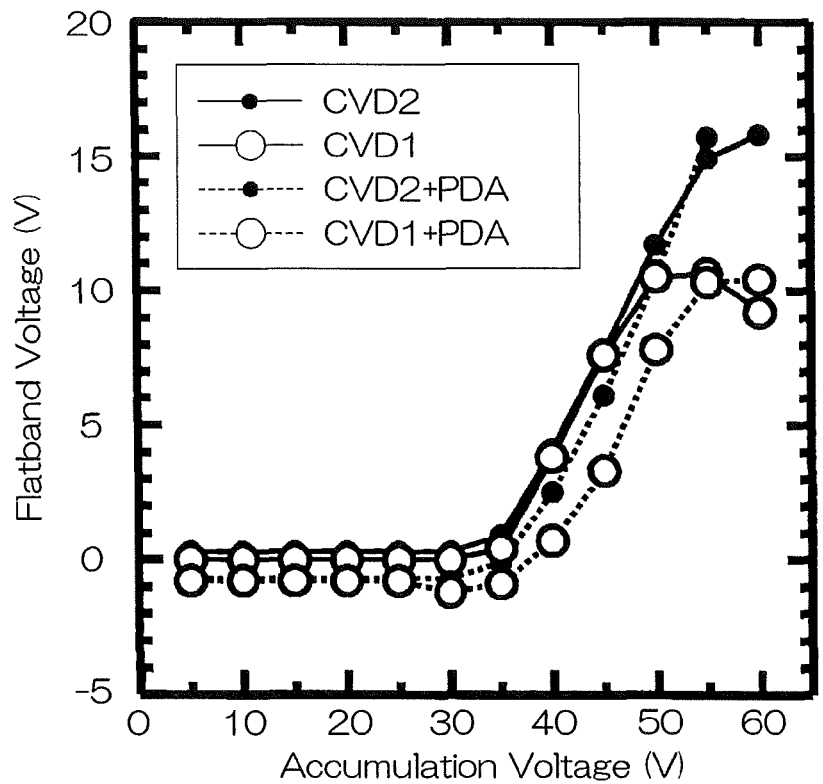
FIG. 11 is a graph for demonstrating dependence of shifting of flatband voltage $V_{FB}$ on N composition.

As shown in FIG. 11, it was found that in comparison to the CVD 2 film, the flatband voltage $V_{FB}$ shift amount can be reduced more with the CVD 1 film that has a higher N composition (concentration). For example, for an accumulation voltage of 55V, whereas the shift amount of the CVD 2 film sample was approximately 15V, the shift amount of the CVD 1 film sample was approximately 10V. Also, in regard to performing or not performing PDA after film formation, it was found that, in comparison to the case of not performing PDA, the shift amount can be reduced more when PDA was performed.

(6) Flatband voltage $V_{FB}$ suppression effect of AlON film

Next, the degree to which the flatband voltage $V_{FB}$ shift amount is suppressed in comparison to the case of using an $Al_2O_3$ film when the PDA film obtained in (5) above is used was examined. The results are shown in FIG. 12.

Figure 12:
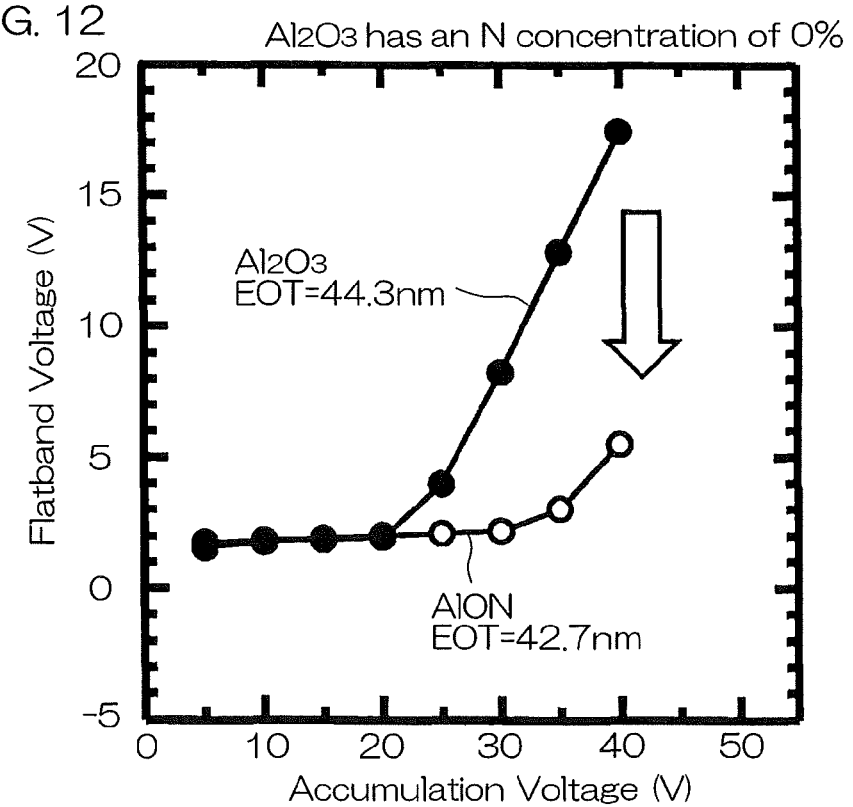
FIG. 12 is a graph for demonstrating a flatband voltage $V_{FB}$ suppression effect by an AlON film.

As shown in FIG. 12, it was found that when an $Al_2O_3$ film with which the N composition is 0% is used, the flatband voltage $V_{FB}$ shift amount becomes extremely large. Consequently, it was found that the shifting of the flatband voltage $V_{FB}$ can be suppressed by including the AlON film in the gate insulating film. The shifting of the threshold voltage $V_{th}$ can thus be suppressed with the MIS structure having the gate insulating film that includes the AlON film.

(7) Relationship of flatband voltage $V_{FB}$ and nitrogen composition

Figure 13:
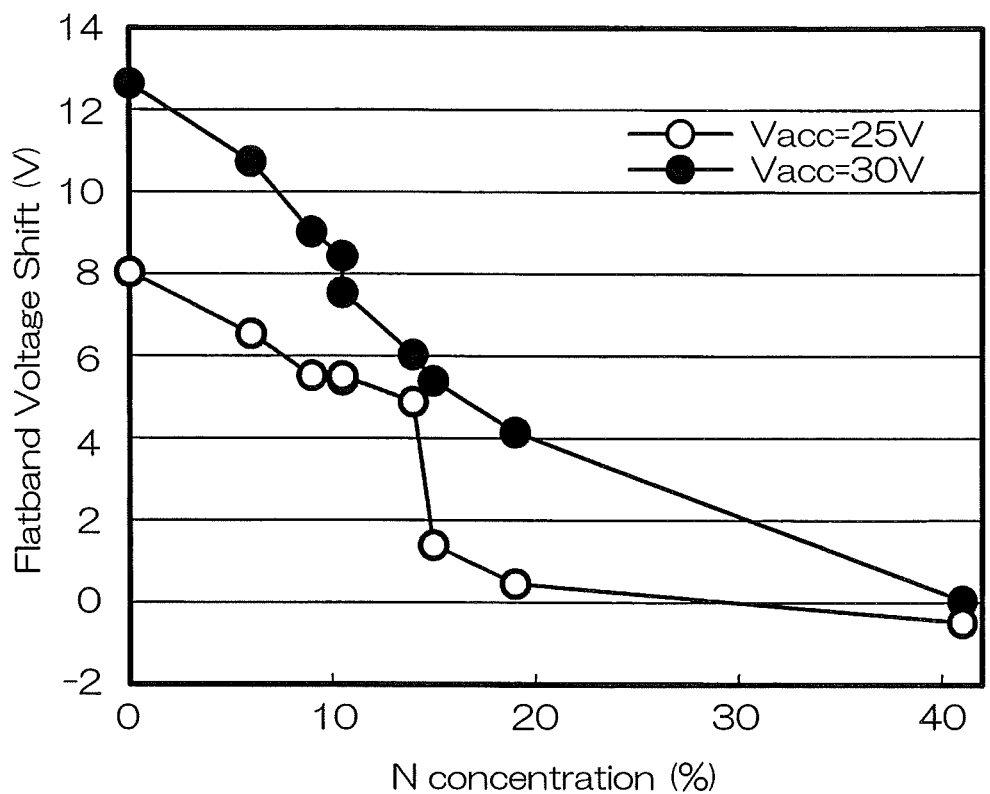
FIG. 13 is a graph showing a relationship of flatband voltage $V_{FB}$ and nitrogen composition.

Next, to empirically verify the dependence of shifting of the flatband voltage $V_{FB}$ on the N composition (at fixed accumulation voltage), the MIS structures shown in FIG. 4 were prepared on Si substrates in accordance with the method described in (2) above. As experimental samples, eight types differing in N composition were prepared. How the flatband voltage $V_{FB}$ shifting of each sample changes were verified for the cases where the accumulation voltage $V_{acc}$ is 25V and 30V. The results are shown in FIG. 13. The verification results obtained are data on Si substrates and are reference data for the case where the same verification is performed with MIS structures on SiC substrates. Based on FIG. 13, an N composition of not less than 15% is preferable because the flatband voltage $V_{FB}$ shifting is low in this case. Also, the N composition is preferably not more than 35% because the dielectric constant decreases when the N composition is high.

The preferred embodiments of the present invention are merely specific examples used for clarifying the technical contents of the present invention, the present invention should not be interpreted as being restricted to these specific examples, and the spirit and scope of the present invention are limited solely by the attached claims.

The present application corresponds to Japanese Patent Application No. 2012-265615 filed in the Japan Patent Office on Dec. 4, 2012, and the entire disclosure of this application is incorporated herein by reference.

DESCRIPTION OF THE SYMBOLS

1 Semiconductor device
2 SiC substrate
3 SiC epitaxial layer
4 Gate trench
9 Gate insulating film
10 Base $SiO_2$ film
11 AlON film
12 Upper $SiO_2$ film
13 Gate electrode
41 Semiconductor device
44 Gate insulating film
45 Gate electrode
47 Base $SiO_2$ film
48 AlON film
49 Upper $SiO_2$ film

What is claimed is:

1. A semiconductor device comprising an MIS structure that includes:
   a semiconductor layer including a first conductivity type drain region, a second conductivity type body region and a first conductivity type source region;
   a source trench penetrating through the source region and the body region from a front surface of the semiconductor layer such that the source trench reaches the drain region;
   a gate insulating film in contact with the semiconductor layer; and
   a gate electrode formed on the gate insulating film such that the gate electrode faces the body region across the gate insulating film;
   wherein the gate insulating film includes an AlON layer with a nitrogen composition of 5% to 40%.

2. The semiconductor device according to claim 1, wherein the AlON layer has a thickness of not less than 50 nm.

3. The semiconductor device according to claim 1, wherein the AlON layer is amorphous or microcrystalline.

4. The semiconductor device according to claim 1, wherein the gate insulating film has a laminated structure that includes a base $SiO_2$ layer in contact with the semiconductor layer and the AlON layer laminated on the base $SiO_2$ layer.

5. The semiconductor device according to claim 4, wherein the base $SiO_2$ layer has a thickness of not less than 5 nm.

6. The semiconductor device according to claim 4, wherein the laminated structure further includes an upper $SiO_2$ layer laminated on the AlON layer.

7. The semiconductor device according to claim 6, wherein the upper $SiO_2$ layer contains Al and/or N at an interface with the AlON layer.

8. The semiconductor device according to claim 1, wherein the semiconductor layer is constituted of SiC, GaN, or diamond.

9. The semiconductor device according to claim 1, wherein the gate electrode is constituted of polysilicon or a metal including at least one type of metal selected from the group consisting of Mo, W, Cu, Ni, Al, Ti, Ag, Au, and Pt.

10. The semiconductor device according to claim 1, wherein the MIS structure includes a trench gate type structure.

11. The semiconductor device according to claim 1, wherein the MIS structure includes a planar gate structure.

12. The semiconductor device according to claim 1, further comprising a second conductivity type impurity region formed at a periphery of the source trench, the second conductivity type impurity region connected to the body region in a lower region of the body region.

* * * * *